United States Patent
Hori

(10) Patent No.: US 7,420,419 B2
(45) Date of Patent: Sep. 2, 2008

(54) VARIABLE GAIN VOLTAGE/CURRENT CONVERTER CIRCUIT HAVING CURRENT COMPENSATION CIRCUIT FOR COMPENSATING FOR CHANGE IN DC CURRENT FLOWING INTO ACTIVE ELEMENT FOR PERFORMING VOLTAGE/CURRENT CONVERSION

(75) Inventor: Shinichi Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 134 days.

(21) Appl. No.: 10/581,555

(22) PCT Filed: Sep. 15, 2004

(86) PCT No.: PCT/JP2004/013433

§ 371 (c)(1),
(2), (4) Date: Jun. 2, 2006

(87) PCT Pub. No.: WO2005/055419

PCT Pub. Date: Jun. 16, 2005

(65) Prior Publication Data

US 2007/0152744 A1 Jul. 5, 2007

(30) Foreign Application Priority Data

Dec. 4, 2003 (JP) .............................. 2003-405601

(51) Int. Cl.
*H03F 3/04* (2006.01)
(52) U.S. Cl. ..................................................... 330/288
(58) Field of Classification Search ................ 330/288; 323/316
See application file for complete search history.

(56) References Cited

U.S. PATENT DOCUMENTS 5,012,139 A * 4/1991 Susak et al. ................. 327/561

FOREIGN PATENT DOCUMENTS

JP 05-283948 10/1993

(Continued)

OTHER PUBLICATIONS

B.I. Miller et al., "Strain-compensated strained-layer superlattices for 1.5 μm wavelength lasers," Appl. Phys. Lett. 58(18), May 6, 1991, pp. 1952-1954, 1991 American Institute of Physics.

(Continued)

*Primary Examiner*—Steven J Mottola
(74) *Attorney, Agent, or Firm*—Foley & Lardner LLP

(57) ABSTRACT

A variable gain voltage/current converter circuit of the present invention has an input section active element having an input terminal, an output terminal, and a ground terminal for performing a voltage/current conversion, a potential control circuit for controlling a conversion gain of the input section active element based on a potential at the output terminal of the input section active element, an output section voltage/current converter circuit for generating a current corresponding to a voltage signal generated from the potential control circuit, and a current compensation circuit connected to the output terminal of the input section active element for generating a DC current in accordance with the amount of DC current which flows from the output terminal of the input section active element to the input section active element. The current compensation circuit compensates for a change in a DC current of the input section active element, which occurs when the conversion gain is adjusted. This minimizes fluctuations in operating points of other circuit elements.

7 Claims, 14 Drawing Sheets

FOREIGN PATENT DOCUMENTS

| JP | 06-061859 | | 3/1994 |
|----|-----------|---|--------|
| JP | 08-032369 | | 2/1996 |
| JP | 08-078973 | | 3/1996 |
| JP | 2000-134045 | A | 5/2000 |
| JP | 2000-269751 | A | 9/2000 |
| JP | 2004-266316 | A | 9/2004 |

OTHER PUBLICATIONS

B. Pankiewicz, et al., "A field programmable analog array for CMOS continuous-time OTA-C filter applications," IEEE Journal of Solid-state circuits, vol. 37:2, Feb. 2002, pp. 125-136.

T. Tsuchiya et al., "Large number of periods in highly strained InGaAlAs/InGaAlAs MQW structures grown by metalorganic vapor-phase epitaxy," 11th International Conference on Indium Phosphide and Related Materials, May 16-20, 1999, pp. 47-50.

A 1.5 V 75 dB-Dynamic Range $3^{rd}$-Order $G_m$-C Filter Integrated in a 0.18 μm Standard Digital CMOS Process, ESSCIRC 2002, pp. 647-650.

C.P. Seltzer, et al., "Zero-net-strain multiquantum well lasers," Electronics Letters, vol. 27:14, Jul. 4, 1991, pp. 1268-1270.

\* cited by examiner

PRIOR ART

VARIABLE GAIN VOLTAGE/CURRENT CONVERTER CIRCUIT HAVING CURRENT COMPENSATION CIRCUIT FOR COMPENSATING FOR CHANGE IN DC CURRENT FLOWING INTO ACTIVE ELEMENT FOR PERFORMING VOLTAGE/CURRENT CONVERSION

TECHNICAL FIELD

The present invention relates to a voltage/current converter circuit (hereinafter called the "gm amplifier") which has a variable conversion gain.

BACKGROUND ART

In recent years, there has been a request for the of a receiver which supports a plurality of radio communication schemes (hereinafter called the "multi-mode supporting receiver"). For configuring this receiver, channel selection filter circuits are required to support the respective communication schemes. Then, this filter is required to have a function of varying a pass band width over a wide range. Generally, when a receiver is implemented in one chip, a so-called gm-C scheme, which is composed of a gm amplifier and capacitance C, is used as a channel selection filter. The gm amplifier must be provided with a conversion gain over a wide range in order to have a function of variable characteristics in the pass band width.

Specifically, the gm amplifier comprises an active element such as a bipolar transistor, a MOS transistor and the like. In an actual design, a mutual conductance value (hereinafter called the "Gm value") is often made electrically controllable between −30% and +30% with respect to a design value in order to deal with process variations. A switching system using a switch circuit is generally used for making adjustments beyond that range.

FIGS. 1A, 1B are circuit diagrams illustrating a first prior art example (see IEEE JSSC vol. 37, no. 2, pp. 125-136, February 2002). FIG. 1A is a circuit diagram illustrating the general configuration. FIG. 1B is a circuit diagram illustrating the internal configuration of programmable current mirror circuit G1 or G2 (11 or 12) in FIG. 1A. In FIGS. 1A, 1B, Q330, Q340, Q350, Q360 are p-type MOS transistors; Q370, Q380, Q390, Q400, Q410, Q420, Q430, Q440, Q450, Q460 are n-type MOS transistors, CS400, CS500, CS600 are current sources; V1 is a voltage source; and SW500, SW600, SW700 are switch circuits. Output current signal Iout is supplied from n-type MOS transistors Q410, Q420, Q430 which are arranged in parallel. N-type MOS transistors Q410, Q420, Q430 are configured to be selected by switch circuits SW500, SW600, SW700, respectively.

As differential input voltage signal Vin+ is applied to gate terminals of MOS transistors Q330 and Q340, and another differential input voltage signal Vin− is applied to gate terminals of MOSS transistors Q350 and Q360, the four MOS transistors supply two programmable current mirror circuits G1 and G2 with a current which has a differential component corresponding to the differential input voltages. By switching switch circuits SW500, SW600, SW700, programmable current mirror circuits G1 and G2 can amplify the current having the differential component by a desired factor to deliver output current signal Iout.

In current mirror circuits G1 and G2 illustrated in FIGS. 1A, 1B, switch circuits SW500 and SW600 are connected to a supply voltage side, and n-type MOS transistors Q410 and Q420 are in an operative state. For reducing the Gm value from this state, switch circuit SW600 must be switched to a ground side. In this way, n-type MOS transistor Q420 is brought into an inoperative state, causing the Gm value to decrease. For increasing the Gm value from the illustrated state, switch circuit SW700 must be switched to the supply voltage side. In this way, n-type MOS transistor Q430 is brought into an operative state, causing the Gm value to increase. One feature of this current mirror circuit lies in that one end of the switch circuit is connected to the gate terminal of the MOS transistor, thus reducing the influence of parasitic components (of resistive and capacitive components) of the switch circuit. The current mirror circuit also has a feature that the Gm value can be varied over a wider width as a larger number of MOS transistors are connected in parallel.

FIG. 2 is a circuit diagram illustrating a second prior art example (see Proc. ESSCIRC 2002, pp. 647-650, 2002).

The second prior art example includes n-type MOS transistors Q100 and Q400, p-type MOS transistors Q200 and Q300, and regulated current source CS200. P-type MOS transistors Q200 and Q300 have size parameters set equal to each other. N-type MOS transistor Q100 operates in a triode region, and generates current signal Ids in accordance with the following equation when input voltage signal Vin is applied to a gate terminal:

[Equation 1]

$$I_{ds} = \beta \cdot \left(V_{gs} - V_{th} - \frac{1}{2}V_{ds}\right) \cdot V_{ds} \quad (1)$$

A Gm value in turn is given by the following equation by differentiating both sides of Equation (1) with Vgs:

[Equation 2]

$$G_m = \beta \cdot V_{ds} \quad (2)$$

where β is a constant, Vth is a threshold, Vgs is a gate-source voltage, and Vds is a drain-source voltage. Vin in FIG. 2 corresponds to gate-source voltage Vgs in Equation (1), and potential VN100 at node N100 corresponds to drain-source voltage Vds.

When control voltage Vt100 is applied to the gate terminal of n-type MOS transistor Q400 which is in a saturation region, current Ids in accordance with the following equation, flows between the drain and source of n-type MOS transistor Q400:

[Equation 3]

$$I_{ds} = \frac{\beta}{2}(V_{tune} - V_N - V_{th})^2 \quad (3)$$

where Vtune is Vt100, VN is potential VN 100 which is the potential at node N100, and Vth is a threshold for n-type MOS transistor Q400. Since Ids is a current supplied from regulated current source CS200, potential VN100 is uniquely determined from Equation (3). As a gate voltage of n-type MOS transistor Q100 fluctuates to cause potential VN100 to increase to a higher potential, the gate-source voltage of n-type MOS transistor Q400 is reduced, thus causing potential VN200 at node N200 to increase. Since potential VN200 is a gate voltage of p-type MOS transistor Q200, potential VN100 is drawn back from the higher potential to a lower potential by the inversion amplification action of p-type MOS transistor Q200.

Conversely, when potential VN100 decreases to a lower potential, a similar principle acts in reverse, so that potential VN100 is drawn back from the lower potential to a higher potential. Eventually, VN, which is potential VN100, is fixed at a value determined from Equation (3) and Vt100 which is Vtune. In other words, Vds in Equation (2) is fixed with respect to a gate input voltage of n-type MOS transistor Q100. Therefore, n-type MOS transistor Q100 exhibits a highly linear voltage/current conversion characteristic. Also, since potential VN100 can be adjusted by control voltage Vt100, the Gm value of n-type MOS transistor Q100 can be adjusted in accordance with Equation (2) in which potential VN100 is substituted into source-drain voltage Vds.

In a state where potential VN100 is fixed, a voltage signal applied to the gate of n-type MOS transistor Q100 is converted to the current signal of n-type MOS transistor Q100 based on Equation (1). The current signal of n-type MOS transistor Q100 is converted to voltage signal VN200 at node N200 within a feedback circuit composed of p-type MOS transistors Q200 and Q400, and then is delivered as current signal Iout of p-type MOS transistor Q300. Since p-type MOS transistors Q200 and Q300 are equal in parameter sizes, the current signal of n-type MOS transistor Q100 is equal to Iout. Thus, the voltage/current conversion characteristic of this prior art example is equal to the voltage/current conversion characteristic of n-type MOS transistor Q100, and has high linearity. Also, since the Gm value of n-type MOS transistor Q100 can be adjusted by control voltage Vt100, the Gm value of this prior art example can also be adjusted by Vt100.

Further, since this prior art example comprises only two or three MOS transistors arranged between the power supply and ground, a sufficient bias voltage can be applied to each MOS transistor even with a low voltage power supply. For this reason, this circuit provides a large input dynamic range.

However, the foregoing first prior art example and second prior art example imply the following problems.

In the first prior art example, the gm amplifier can be provided with a wide gain variable range. However, since a switch circuit must be used, a digital circuit is required for controlling the switch circuit, resulting in a complicated circuit configuration in which the analog circuit for use with the MOS transistors is mixed with the digital circuit. As a result, there is the problem that the chip area needs to be increased.

In the second prior art example, since no switch circuit is used, no digital circuit is required for the switch circuit. Consequently, the chip area is reduced. However, when an attempt is made to adjust the gain over a wide range, difficulties are experienced in maintaining the operating points of the MOS transistors in a desired region, thus presenting a problem that the linearity is significantly degraded in the event of voltage/current conversion.

DISCLOSURE OF THE INVENTION

It is an object of the present invention to solve the problems of the prior art examples described above, and to provide a variable gain voltage/current converter circuit which is capable of maintaining high linearity for a voltage/current conversion by applying an adjusting voltage to a single control terminal to vary the gain over a wide range, without the need for a digital control circuit.

To achieve the above object, a variable gain voltage/current converter circuit of the present invention has an input section active element having an input terminal, an output terminal, and a ground terminal for performing voltage/current conversion, a potential control circuit for controlling conversion gain of the input section active element based on a potential at the output terminal of the input section active element, an output section voltage/current converter circuit for generating a current corresponding to a voltage signal generated from the potential control circuit, and a current compensation circuit connected to the output terminal of the input section active element for generating a DC current in accordance with the amount of DC current which flows from the output terminal of the input section active element to the input section active element.

As described above, the current compensation circuit is connected to the output terminal of the active element for performing voltage/current conversion. The current compensation circuit compensates for a change in the DC current of the input section active element, which occurs when the conversion gain is adjusted. This can minimize fluctuations in the operating points of other circuit elements. Therefore, even if the gain is adjusted, each circuit element can operate in a state substantially similar to that before the gain adjustment, thus making it possible to stably vary the gain over a wide range.

BEST MODE FOR CARRYING OUT THE INVENTION

First Embodiment

Figure 3A:
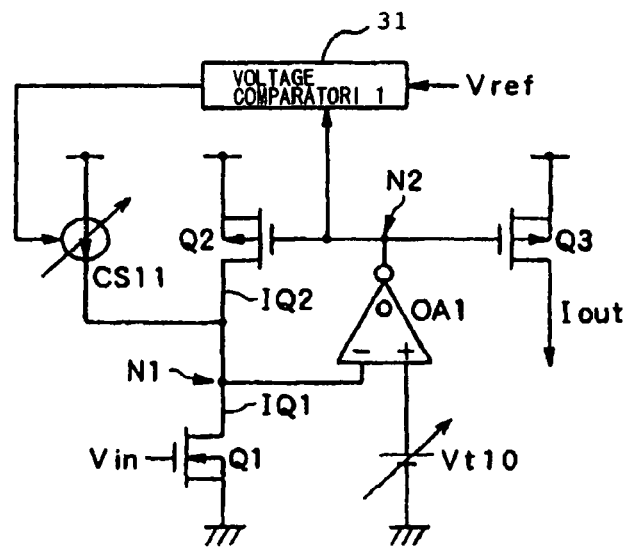
FIG. 3A a circuit diagram illustrating a first embodiment of the present invention.
Figure 3B:
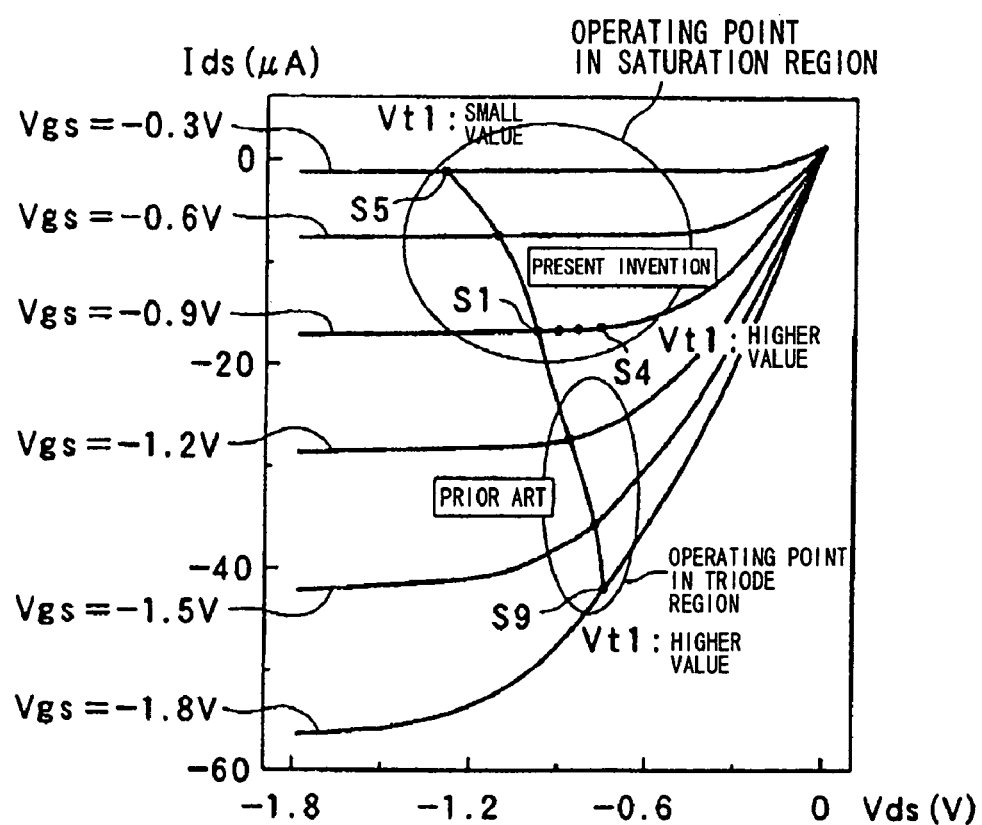
FIG. 3B is a diagram for describing the operation of p-type MOS transistor Q2 in FIG. 3A.

FIG. 3A is a circuit diagram illustrating a first embodiment of the present invention, and FIG. 3B is an operation diagram of p-type MOS transistor Q2 in FIG. 3A. In this embodiment, n-type MOS transistor Q1 is used as an input section active element for performing a voltage/current conversion, and p-type MOS transistor Q2 is used as a potential control circuit. Also, variable current source CS11 is used as a current compensation circuit, and p-type MOS transistor Q3 is used as an output section voltage/current converter circuit. Operational amplifier OA1 is connected to an output terminal of the input section active element; a gate terminal of p-type MOS transistor Q2 is connected to an output terminal of operational amplifier OA1; and a drain terminal of p-type MOS transistor Q2 is connected to a drain terminal of n-type MOS transistor Q1. A gate terminal of p-type MOS transistor Q3 is connected to the gate terminal of p-type MOS transistor Q2, and p-type MOS transistor Q3 and p-type MOS transistor Q2 have the same size parameters. A voltage signal applied to the gate terminal of n-type MOS transistor Q1 includes a DC voltage for biasing an operating point of n-type MOS transistor Q1 in a saturation region.

The operation principles of the variable gain voltage/current converter circuit in FIG. 3A will be described below.

Potential VN1 at node N1 is fixed to control voltage Vt by a feedback circuit composed of operational amplifier OA1 and p-type MOS transistor Q2 according to the following principles. When potential VN1 increases to a higher value than control voltage Vt10, operational amplifier OA1 generates a high-level voltage. As this voltage is applied to the gate terminal of p-type MOS transistor Q2, potential VN1 is drawn back from the high voltage to a lower voltage by the inversion amplification action of p-type MOS transistor Q2. Conversely, as potential VN1 decreases to a value lower than control voltage Vt10, operational amplifier OA1 generates a so-called low-level voltage. As this voltage is applied to the gate terminal of p-type MOS transistor Q2, potential VN1 is drawn back from the low voltage to the higher voltage by the inversion amplification action of p-type MOS transistor Q2. Therefore, potential VN1 at node N1 is fixed to a state equal to control voltage Vt10.

Since voltage signal Vin applied to the gate terminal of n-type MOS transistor Q1 includes a DC voltage component for biasing the operating point of n-type MOS transistor Q1 in a triode region, voltage signal Vin applied to the gate terminal is converted to a current signal in accordance with Equation (1). Since potential VN1 is fixed to the same value as control voltage Vt10, drain-source voltage Vds of n-type MOS transistor Q1 in Equation (2) has a fixed value. Thus, the Gm value has a fixed value. Consequently, n-type MOS transistor Q1 is improved in the linearity of its voltage/current conversion characteristic. This current signal is converted to a voltage signal at node N2 within the feedback circuit composed of operational amplifier OA1 and p-type MOS transistor Q2, and then delivered as current signal Iout of p-type MOS transistor Q3. Also, since p-type MOS transistors Q2 and Q3 have equal MOS transistor size parameters, current signal IQ2 of p-type MOS transistor Q2 is equal to current signal Iout of p-type MOS transistor Q2. Since n-type MOS transistor Q1 exhibits high linearity of voltage/current conversion characteristic, the conversion characteristic of output signal Iout to input voltage signal Vin also exhibits high linearity.

Also, as control voltage Vt10 is varied, potential VN1 at node N1 varies in correspondence thereto. Since potential VN1 is equal to Vds in Equation (2), the Gm value of n-type MOS transistor Q1 in Equation (2) can be adjusted by varying control voltage Vt10. Specifically, as control voltage Vt10 is increased to set the Gm value high, potential VN1 increases. Since drain-source voltage Vds in Equation (1) corresponds to potential VN1, it is understood that a substitution of VN1 into drain-source voltage Vds results in an increase in bias current IQ1 of n-type MOS transistor Q1 corresponding to drain-source current Ids in Equation (1). When control voltage Vt10 is increased, DC voltage component VN2 decreases at node N2 which is the output terminal of operational amplifier OA1, causing the gate potential of p-type MOS transistor Q2 to decrease as well. This results in an increase in the absolute value of gate-source voltage VG2gs of p-type MOS transistor Q2, causing an increase in bias current IQ2 of p-type MOS transistor Q2. When DC voltage component VN2 decreases to be equal to external reference voltage Vref, a signal is supplied from voltage comparator 1 (31) to variable current source CS11 such that a subsequent increase in bias current IQ1 of n-type MOS transistor Q1 is supplied from variable current source CS11. With this configuration, even if the Gm value is adjusted to a high value, DC voltage component VN2 at node N2 will not fall below external reference voltage Vref, so that the operating point of p-type MOS transistor Q2 is maintained in the saturation region over a wide adjusting range of control voltage Vt10. Stated another way, in this embodiment, the operating point of each element can be maintained in a desired operating region over a wide Gm value adjusting range, thus maintaining high linearity.

In FIG. 3B, movement of the operating point of p-type MOS transistor Q2 as the Gm value is adjusted will be compared between the case where variable current source CS11 is not connected to the drain terminal of Q2 and the case where variable current source CS11 is connected to the drain terminal of Q2.

When variable current source CS11 is not connected to the drain rain terminal of p-type MOS transistor Q2, the operating point of Q2 moves from S5 to S1 as control voltage Vt10 is increased from a sufficiently small value. Then, when DC voltage VN1 at node N1 becomes equal to Vref, the operating point of Q2 reaches S1. As control voltage Vt is further increased from that state, the operating point of Q2 moves toward S9, and enters the triode region. This means that the operating point of Q2 goes out of a desired region, causing degradation in the linearity of the voltage/current conversion.

When variable current source CS11 is connected to the drain terminal of p-type MOS transistor Q2, the operating point of Q2 moves from S5 to S1 as control voltage Vt10 is increased from a sufficiently small value. Then, when DC voltage VN1 at node N1 becomes equal to Vref, the operating point of Q2 reaches S1. As control voltage Vt10 is further increased, the bias current of Q2 will not subsequently increase because Q1 is supplied with a bias current from CS11, and remains constant. This means that the operating point of Q2 moves toward S4 after moving to S1 within the saturation region. This means that the operating point of Q2 is maintained in the saturation region over a wide adjusting range of the Gm value, thus maintaining high linearity of voltage/current conversion.

From the foregoing, the variable gain voltage/current converter circuit of this embodiment is capable of highly linear operations over a wide Gm value adjusting range.

FIRST EXAMPLE

Figure 4:
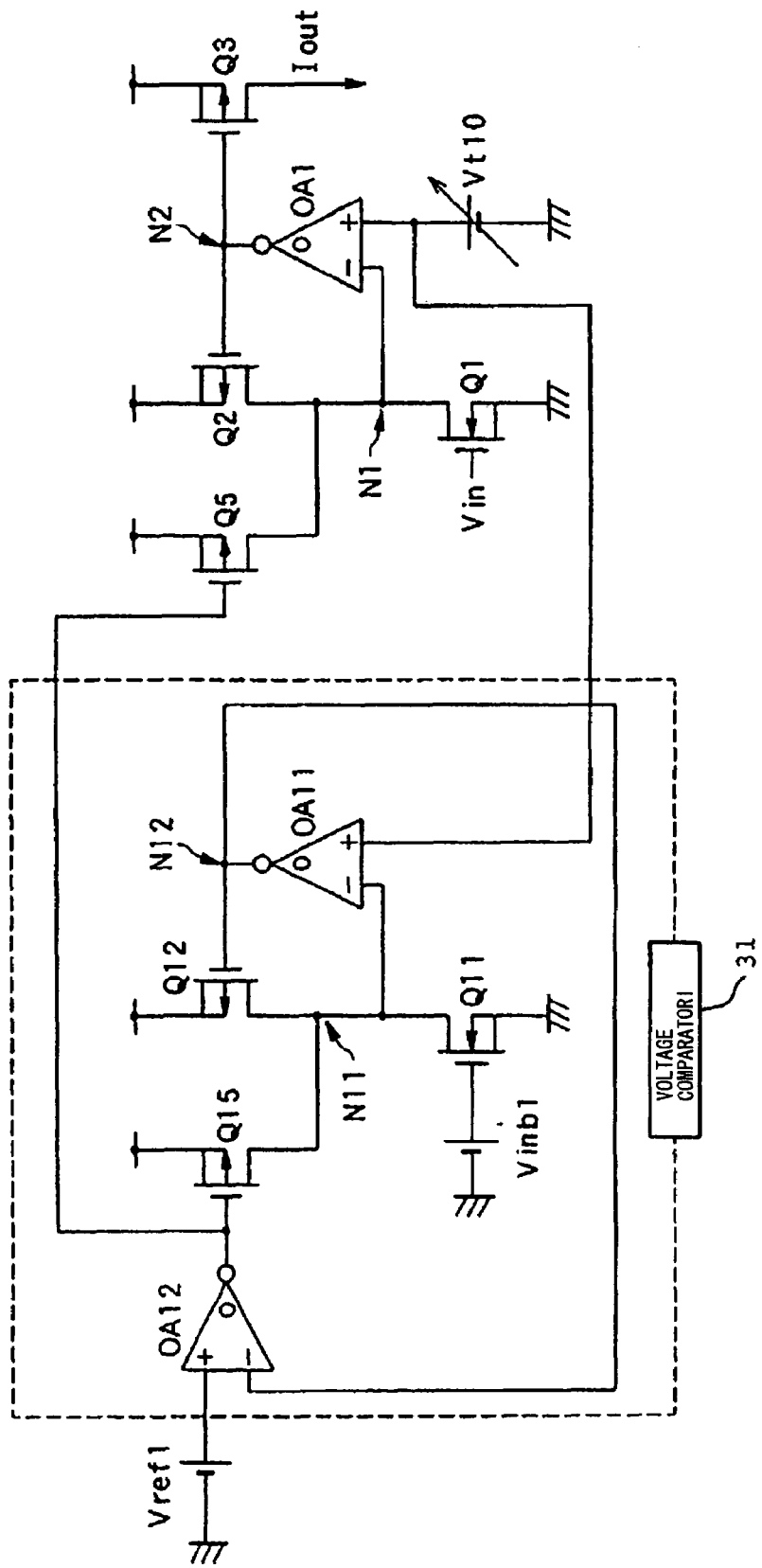
FIG. 4 is a circuit diagram illustrating a first example of the present invention.

FIG. 4 is a circuit diagram illustrating a first example of the present invention, more specifically showing the circuit diagram of FIG. 3. In FIG. 4, a circuit corresponding to voltage comparator 1 employs n-type MOS transistor Q1, p-type MOS transistors Q2 and Q5, n-type MOS transistor Q11, p-type MOS transistors Q12 and Q15, and operational amplifier OA11. Reference voltage Vref1 is applied to a plus (+) input terminal of operational amplifier OA12, a gate terminal of p-type MOS transistor Q12 is connected to a minus (−) input terminal, and a gate terminal of p-type MOS transistor Q15 is connected to an output terminal of operational amplifier OA12. The output terminal of operational amplifier OA12 is connected to a gate terminal of p-type MOS transistor Q5.

The output terminal of operational amplifier OA12 generates a high-level signal when bias potential VN12 at node N12 exceeds reference voltage Vref. As a result, p-type MOS transistors Q5 and Q15, connected to the output terminal of operational amplifier OA12, are turned off. On the other hand, as potential VN12 at node N12 is lower than the value of reference voltage Vref1, the output terminal of operational amplifier OA12 generates a voltage signal to the gate terminal of p-type MOS transistor Q15 such that potential VN12 becomes equal to referenced voltage Vref1, thus adjusting the bias current of n-type MOS transistor Q11. This voltage signal at the output terminal of operational amplifier OA12 is also applied to the gate terminal of p-type MOS transistor Q5, causing bias potential VN2 at node N2 to become equal to bias potential VN12. Therefore, even if the Gm value is adjusted by control voltage Vt, bias potential VN2 will not fall below reference voltage Vref1, so that p-type MOS transistor Q2 can operate in the saturation region over a wide adjusting range of control voltage Vt10. From the foregoing, the variable gain voltage/current converter circuit of this example is capable of highly linear operations over a wide adjusting range of the Gm value.

Second Embodiment

Figure 5:
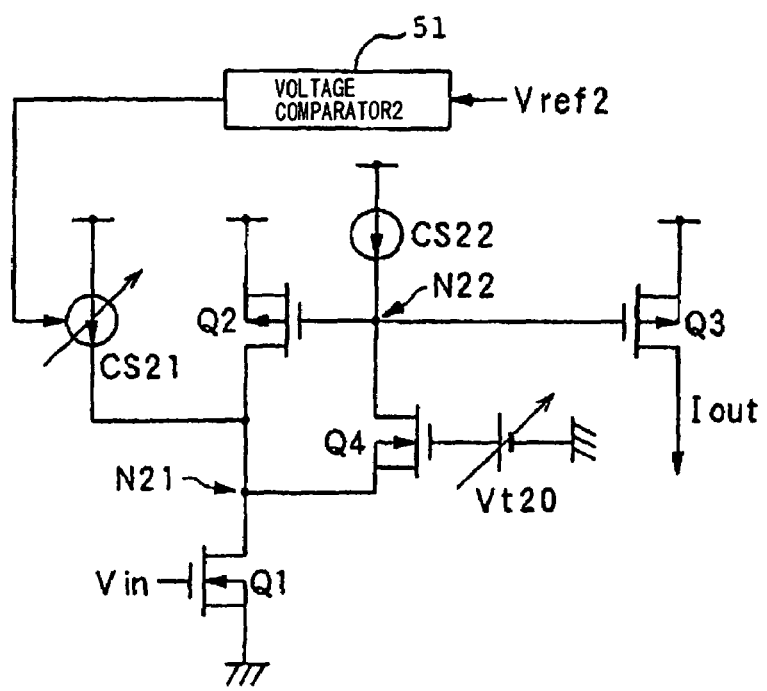
FIG. 5 is a circuit diagram illustrating a second embodiment of the present invention.

FIG. 5 is a circuit diagram illustrating a second embodiment of the present invention. N-type MOS transistor Q1, p-type MOS transistors Q2 and Q3, and variable current source CS12 are elements similar to those in FIG. 3.

In this embodiment, n-type MOS transistor Q1 is used as an input section active element for performing a voltage/current conversion, and n-type MOS transistor Q4, variable current source CS21, and p-type MOS transistor Q2 are used as a potential control circuit.

A source terminal of n-type MOS transistor Q4 is connected to a drain terminal of n-type MOS transistor Q1, a drain terminal of n-type MOS transistor Q4 is connected to regulated current source CS22, and a gate terminal of p-type MOS transistor Q2 is connected to the drain terminal of n-type MOS transistor Q4. Variable current source CS21 is used as a current compensation circuit. P-type MOS transistor Q3 is used as an output section active element. P-type MOS transistor Q3 has a gate terminal connected to the gate terminal of Q2, and has the same size parameters as p-type MOS transistor Q2. An input voltage applied to a gate terminal of n-type MOS transistor Q1 includes a DC voltage component for biasing the operating point of n-type MOS transistor Q1 in a triode region.

As control voltage Vt20 is applied to a gate terminal of n-type MOS transistor Q4 which is in the saturation region, drain-source current Ids of n-type MOS transistor Q4 is current I supplied from regulated current source SC22, so that potential VN21 is uniquely determined from Equation (3). As a gate voltage of n-type MOS transistor Q1 fluctuates to cause potential VN21 to increase to a value higher than the value calculated by Equation (3), the gate-source voltage of n-type MOS transistor Q4 becomes lower, causing potential VN22 at node N22 to increase by the inversion amplification action of n-type MOS transistor Q4. Since potential VN22 is the gate voltage of p-type MOS transistor Q2, VN21 is drawn back to the lower potential by the inversion amplification action of p-type MOS transistor Q2.

Conversely, as potential VN21 decreases to a value lower than the value calculated by Equation (3), a similar principle acts in reverse, causing the potential of the potential VN21 to be drawn up to a higher potential. Eventually, potential VN21 is fixed to a value determined from Equation (3) and Vt20. Therefore, drain-source voltage Vds of n-type MOS transistor Q1, represented by Equation (2), corresponds to the gate input voltage of n-type MOS transistor Q1, so that the voltage/current conversion characteristic of n-type MOS transistor Q1 has high linearity. Also, since potential VN21 can be adjusted by control voltage Vt20, the Gm value of n-type MOS transistor Q1 can be adjusted in accordance with Equation (2) in which potential VN21 is substituted into Vds.

With potential VN21 remaining fixed, a voltage signal applied to the gate terminal of n-type MOS transistor Q1 is converted to a current signal of n-type MOS transistor Q1 based on Equation (1). The current signal of n-type MOS transistor Q1 is converted to a voltage signal at node N22 within a feedback circuit composed of p-type MOS transistor Q2 and n-type MOS transistor Q4, and then is delivered as current signal Iout of p-type MOS transistor Q3. Since p-type MOS transistors Q2 and Q3 have equal MOS transistor size parameters, the current signal of n-type MOS transistor Q1 is equal to current signal Iout. Therefore, the voltage/current conversion characteristic of this embodiment has high linearity, equal to the voltage/current conversion characteristic of n-type MOS transistor Q1.

Also, since potential VN21 can be controlled by varying control voltage Vt20, the Gm value can be adjusted for n-type MOS transistor Q1. In addition, the current signal of n-type MOS transistor Q1 is equal to current signal Iout. Therefore, the Gm value of this embodiment can be adjusted by control voltage Vt20.

When Vt20 is increased in order to set the Gm value high, potential VN 21 increases. As potential VN21 is substituted into Vds in Equation (1), a bias current of n-type MOS transistor Q1 increases. In order to deal with this increase, the feedback circuit composed of p-type MOS transistor Q2 and n-type MOS transistor Q4 reduces the voltage of DC voltage component VN22 at internal node N22 to increase the bias current of p-type MOS transistor Q2. When DC voltage component VN22 at internal node N22 decreases to be equal to external reference voltage Vref2, a signal is supplied from voltage comparator 2 (51) to variable current source CS21 such that a subsequent increase in the bias current of p-type MOS transistor Q2 is supplied from variable current source CS21 to n-type MOS transistor Q1. With this circuit, even if the Gm value is adjusted to be high, DC voltage component VN22 at internal node N22 will not have a voltage lower than Vref2.

Therefore, the operating point of n-type MOS transistor Q4 is maintained in the saturation region over a wide adjusting range of control voltage Vt20. This means the ability of this embodiment to avoid the phenomenon of a degradation in the linearity due to a transition of the operating point of n-type MOS transistor Q4 to the triode region. From the foregoing, the variable gain voltage/current converter circuit is capable of highly linear operations over a wide adjusting range of the Gm value.

SECOND EXAMPLE

Figure 6:
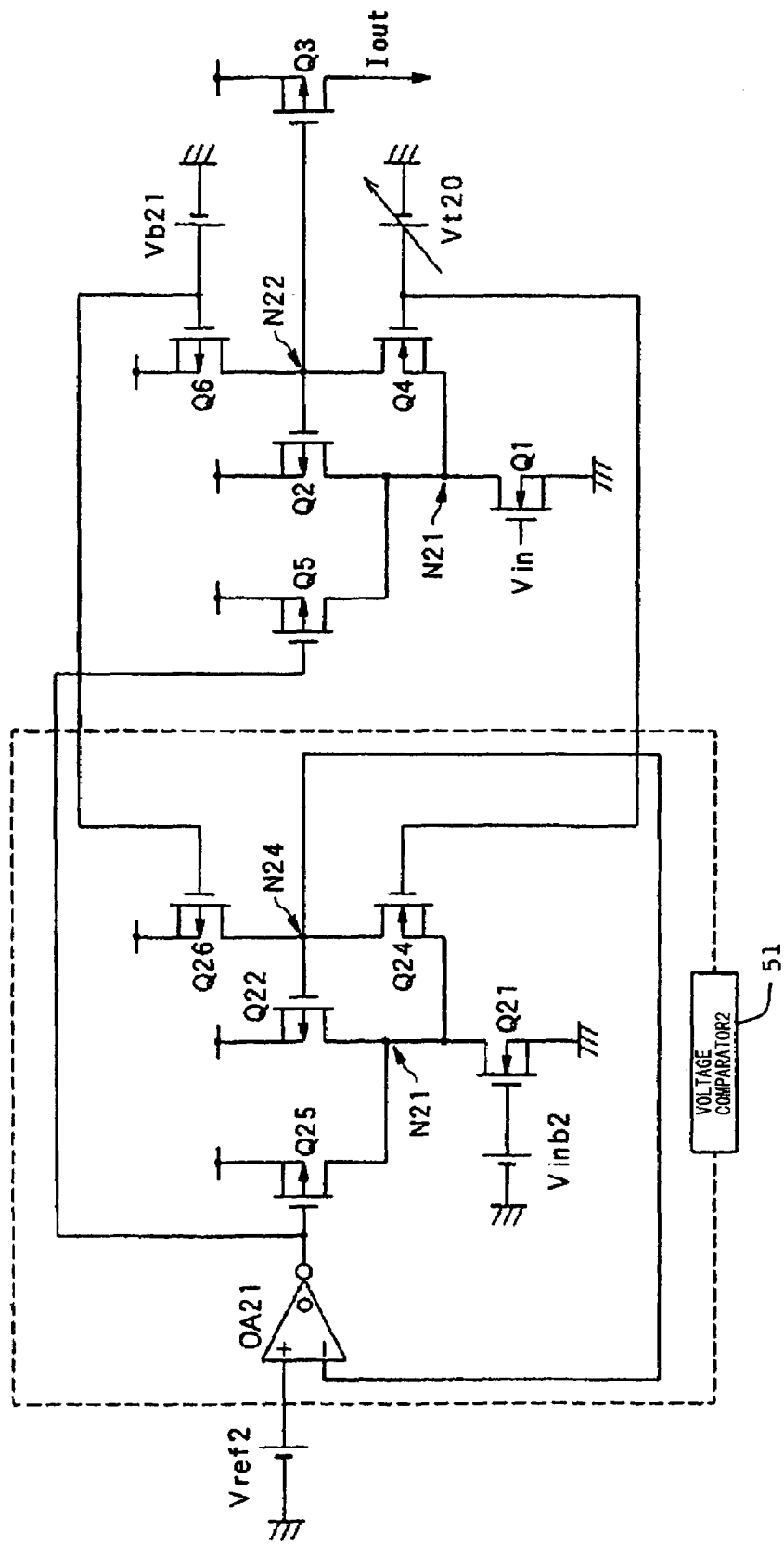
FIG. 6 is a circuit diagram illustrating a second exemplary implantation of the present invention.

FIG. 6 is a circuit diagram illustrating a second example of the present invention, more specifically showing the circuit diagram of FIG. 5.

In FIG. 6, a circuit corresponding to voltage comparator 2 in FIG. 5 employs n-type MOS transistor Q21, p-type MOS transistor Q22, n-type MOS transistor Q24, p-type MOS transistor Q25 and the like.

Reference voltage Vref2 is applied to the plus (+) input terminal of operational amplifier OA21, a gate terminal of p-type MOS transistor Q25 is connected to a minus (−) input terminal, and the gate terminal of p-type MOS transistor Q25 is connected to an output terminal of operational amplifier OA2. The output terminal of operational amplifier OA21 is an output terminal of voltage comparator 2, and is connected to a gate terminal of p-type MOS transistor Q5. Also, p-type MOS transistor Q6 is used as an element corresponding to regulated current source CS22 in FIG. 5. Bias voltage Vb21 is applied to a gate terminal of p-type MOS transistor Q6. Within the circuit of voltage comparator 2, p-type MOS transistor Q26 that corresponds to p-type MOS transistor Q6 is used.

The output terminal of operational amplifier OA21 generates a high-level signal when potential VN24 at node N24 exceeds Vref2, to turn off p-type MOS transistors Q5 and Q25. On the other hand, when a bias current value of n-type MOS transistor Q21 decreases, causing potential VN24 to be lower than reference voltage Vref2, a voltage signal is delivered from the output terminal of operational amplifier OA21 to the gate terminal of p-type MOS transistor Q25 such that potential VN24 becomes equal to reference voltage Vref2. This voltage signal from the output terminal of operational amplifier OA21 is also applied to the gate terminal of p-type MOS transistor Q5, so that bias potential VN21 at node 21 is equal to potential VN24. In other words, even if the Gm value is adjusted using control voltage Vt20, the bias potential of potential VN21 will not fall below reference voltage Vref2. Therefore, n-type MOS transistor Q4 can operate in the saturation region over a wide adjusting range of control voltage Vt21. From the foregoing, this example is capable of highly linear voltage/current conversion operations over a wide adjusting range of the Gm value.

Third Embodiment

Figure 7:
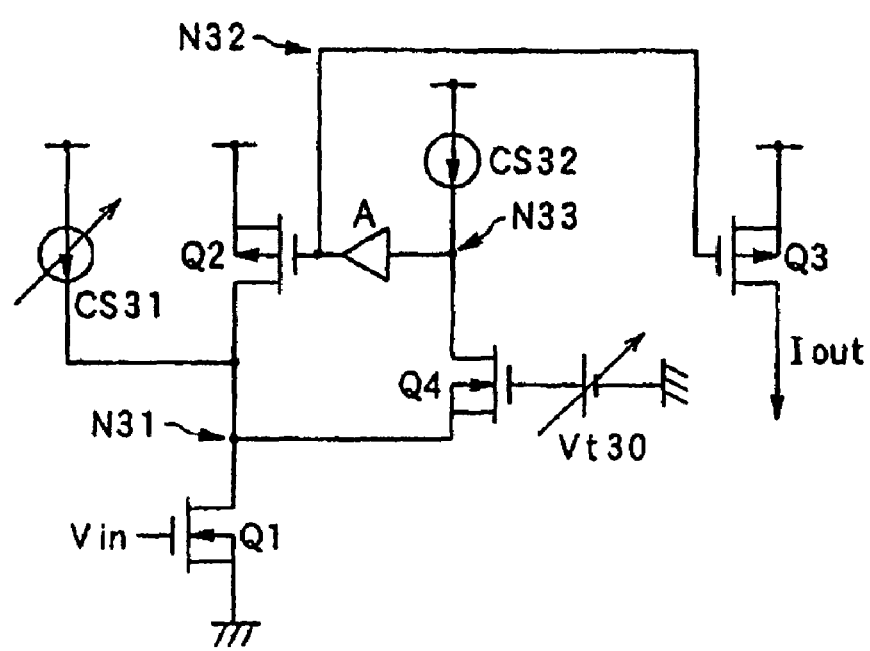
FIG. 7 is a circuit diagram illustrating a third embodiment of the present invention.

FIG. 7 is a circuit diagram illustrating a third embodiment of the present invention. A circuit illustrating the third embodiment includes n-type MOS transistors Q1 and Q4, p-type MOS transistors Q2 and Q3, variable current source CS31, regulated current source CS32, and amplifier A having gain GA larger than one.

In this embodiment, n-type MOS transistor Q1 is used as an input section active element for performing a voltage/current conversion. Also, a potential control circuit employs n-type MOS transistor Q1, regulated current source CS32, amplifier A, and p-type MOS transistor Q2.

A source of n-type MOS transistor Q4 is connected to a drain terminal of n-type MOS transistor Q1, regulated current source CS32 is connected to a drain terminal of n-type MOS transistor Q4 and to an input terminal of amplifier A, a gate terminal of p-type MOS transistor Q2 is connected to an output terminal of amplifier A, and a drain terminal of p-type MOS transistor Q2 is connected to the drain terminal of n-type MOS transistor Q1.

Variable current source CS31 is used as a current compensation circuit, and p-type MOS transistor Q3 is used as an output section active element. A gate terminal of p-type MOS transistor Q3 is connected to the gate terminal of p-type MOS transistor Q2. P-type MOS transistors Q2 and Q3 have the same size parameters. An external signal applied to a gate terminal of n-type type MOS transistor Q1 includes a DC voltage component for biasing an operating point of Q1 in a triode region.

The following equation is established between AC voltage signal component VN32_AC at node N32 and AC voltage signal component VN33_AC at node N33, where the gain of amplifier A is GA:

[Equation 4]

$$V_{\text{N33\_AC}} = \frac{V_{\text{N32\_AC}}}{G_A} \quad (4)$$

From this equation, VN32_AC is equal to VN33_AC when gain GA of amplifier A is one, so that this embodiment in this case is equivalent to the second embodiment. However, in this embodiment where gain GA of amplifier A is sufficiently larger than one, since voltage VN33_AC is compressed to be smaller, signal distortion produced by n-type MOS transistor Q4 is smaller than that of the second embodiment. Accordingly, this embodiment can reduce the distortion produced by n-type MOS transistor Q4, as compared with the second embodiment, and is capable of operations with a highly linear voltage/current conversion characteristic over a wide adjusting range of the Gm value.

THIRD EXAMPLE

Figure 8:
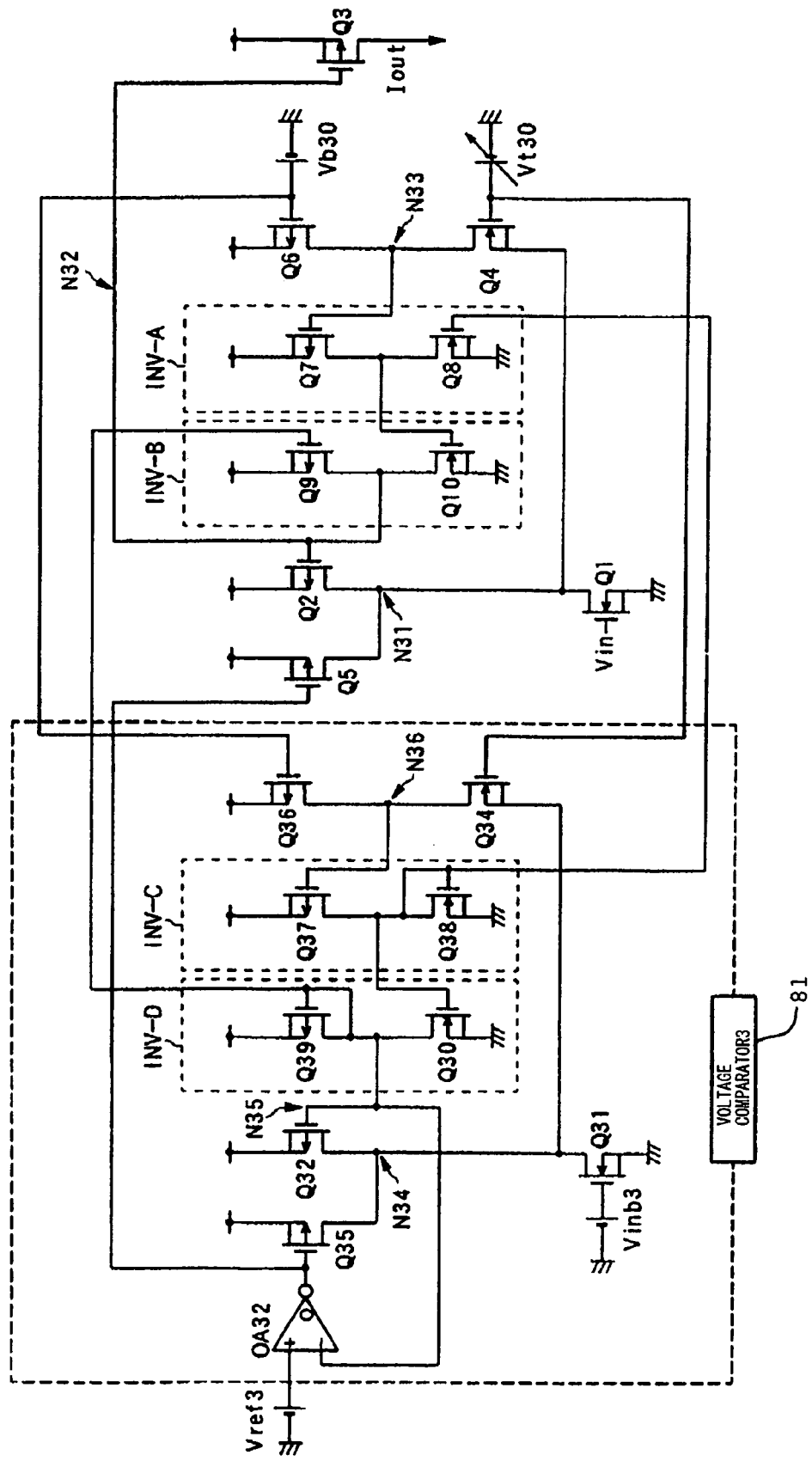
FIG. 8 is a circuit diagram illustrating a third example of the present invention.

FIG. 8 is a circuit diagram illustrating a third example of the present invention, more specifically showing the circuit diagram of FIG. 7.

In FIG. 8, parts identical to those in FIG. 6 are designated the same reference numerals. In the second embodiment illustrated in FIG. 6, the gate terminals of p-type MOS transistors Q2 and Q3 are connected to the drain terminal of n-type MOS transistor Q4. In this embodiment, on the other hand, the gate terminals of p-type MOS transistors Q2 and Q3 are connected to an output terminal of inverter circuit unit INV-B which is constructed by connecting a drain. terminal of p-type MOS transistor Q9 to a drain terminal of n-type MOS transistor Q10. A gate terminal of n-type MOS transistor Q10, which is an input terminal of inverter circuit unit INV-B, is connected to an output terminal of inverter circuit unit INV-A which is constructed by connecting a drain terminal of p-type MOS transistor Q7 to a drain terminal of n-type MOS transistor Q8. A gate terminal of p-type MOS transistor Q7, which is an input terminal of inverter circuit unit INV-A, is connected to a drain terminal of n-type MOS transistor Q4.

INV-A and INV-B, which are two inverter circuit units, apply a gate terminal of n-type MOS transistor Q8 with a voltage at a node at which the gate terminal and the drain terminal of n-type MOS transistor Q38 are connected in a bias circuit shown in FIG. 8, and apply a gate terminal of p-type MOS transistor Q9 with a voltage at a node at which the gate terminal and the drain terminal of p-type MOS transistor Q39 are connected, thereby functioning as an amplifier. Assuming that GA designates the gain of the amplifier composed of inverter circuit unit INV-A and inverter circuit unit INV-B, a voltage signal applied to n-type MOS transistor Q1 has a voltage signal amplitude attenuated to 1/GA at node N33 which is the drain terminal of n-type MOS transistor Q4, as compared with that in the second embodiment. Thus, voltage VN33 at node N33 has an amplitude value reduced by a factor of GA even if large voltage signal Vin is applied to n-type MOS transistor Q1. It is therefore possible to stably operate n-type MOS transistor Q4 and p-type MOS transistor Q6 in the saturation region to keep a high linearity for the voltage/current converter circuit of this example.

Fourth Embodiment

Figure 9A:
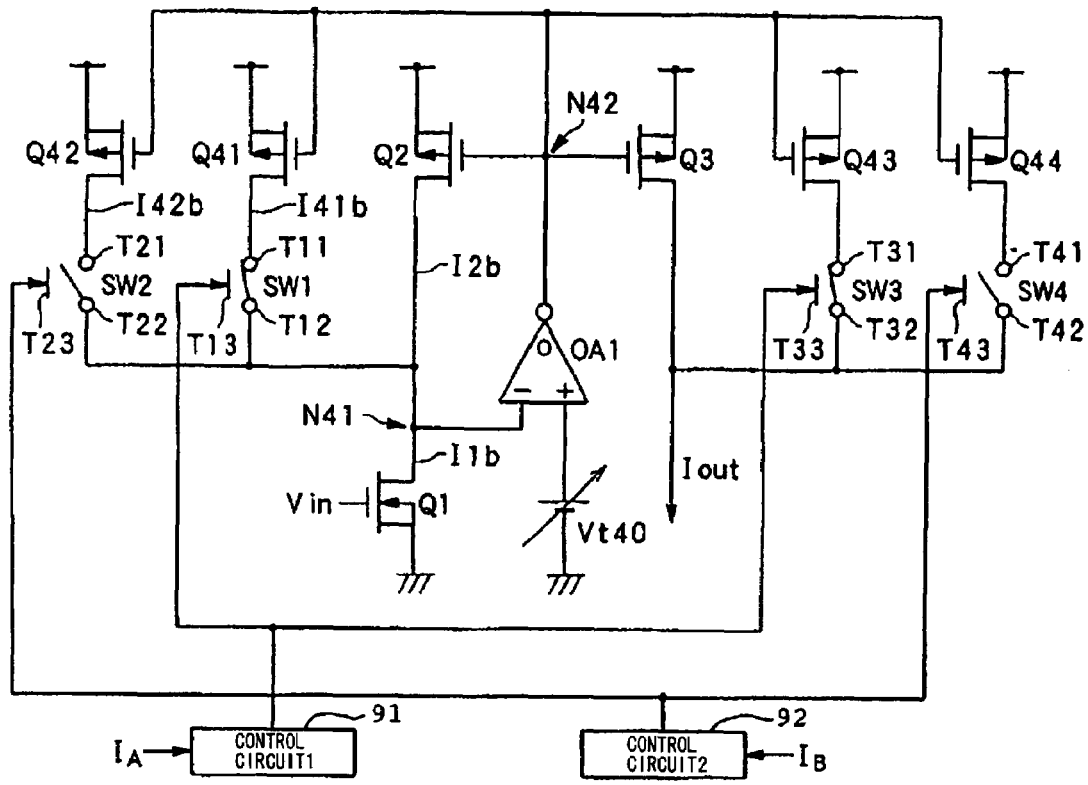
FIG. 9A is a circuit diagram illustrating a fourth embodiment of the present invention.

FIG. 9A is a circuit diagram illustrating a fourth embodiment of the present invention. Operational amplifier OA1, p-type MOS transistors Q2 and Q3, and operational amplifier OA1 are elements similar to those in FIG. 3. In this embodiment, n-type MOS transistor Q1 is used as an input section active element for performing voltage/current conversion. Operational amplifier OA1 and p-type MOS transistor Q2 are used as a potential control circuit connected to an output terminal of this input section active element. A gate terminal of p-type MOS transistor Q2 is connected to an output terminal of operational amplifier OA1, and a drain terminal of p-type MOS transistor Q2 is connected to a drain terminal of n-type MOS transistor Q1. Also, p-type MOS transistor Q3 is used as an output section voltage/current converter circuit. A gate terminal of p-type MOS transistor Q3 is connected to the gate terminal of p-type MOS transistor Q2.

Gate terminals of p-type MOS transistors Q41 and Q42 are connected to the gate terminal of p-type MOS transistor Q2. Input/output terminal T11 of switch circuit SW1 is connected to a drain terminal of p-type MOS transistor Q41, and an input/output terminal of switch circuit SW2 is connected to a drain terminal of p-type MOS transistor Q42.

Gate terminals of p-type MOS transistors Q42 and Q44 are to the gate terminal of p-type MOS transistor Q3. Input/output terminal T31 of switch circuit SW3 is connected to a drain terminal of p-type MOS transistor Q43, and input/output terminal T41 of switch circuit SW4 is connected to a drain terminal of p-type MOS transistor Q44.

Control circuit 1 (91) is connected to control terminal T13 of switch circuit SW1 and to control terminal T33 of switch circuit SW3. Control circuit 2 (92) is connected to control terminal T43 of switch circuit SW2 and to control terminal T23 of switch circuit SW3.

When bias current I1b of n-type MOS transistor Q1 is equal to or smaller than control current IA, a switch circuit off signal is supplied from control signal circuit 1 to control terminal T13 of switch circuit SW1 and to control terminal T33 of switch circuit SW3. When bias current I1b of n-type MOS transistor Q1 is equal to or larger than control current IA, a switch circuit on signal is supplied from control signal circuit 1 to control terminal T13 of switch circuit SW1 and to control terminal T33 of switch circuit SW3.

Likewise, when bias current I1b of n-type MOS transistor Q1 is equal to or smaller than control current IB, a switch circuit off signal is supplied from control signal circuit 2 to control terminal T43 of switch circuit SW2 and to control terminal T43 of switch circuit SW4. When bias current I1b of n-type MOS transistor Q1 is equal to or smaller than control current IB, a switch circuit on signal is supplied from control signal circuit 1 to control terminal T23 of switch circuit SW2 and to control terminal T43 of switch circuit SW4.

In this embodiment, an operation is performed in a manner similar to the circuit of the second prior art example when all of switch circuits SW1 to SW4 remain in the off state. Specifically, potential VN41 at node N41 is adjusted by adjusting control voltage Vt40 to adjust the Gm value.

Next, a description will be given of the operation of the circuit when control voltage Vt40 varies. When control voltage Vt40 is sufficiently low, i.e. close to the ground voltage, all switch circuits SW1 to SW4 turn off if bias current I1b is smaller than control current IA. In this event, voltage signal Vin applied to n-type MOS transistor Q1 is conveyed in the order of a current signal of n-type MOS transistor Q1, a gate voltage signal of p-type MOS transistor Q2, and current signal Iout of p-type MOS transistor Q3, in a manner similar to the second prior art example.

When control voltage Vt40 is increased to adjust bias current I1b between control currents IA and IB, switch circuit SW1 and switch circuit SW3 turn on, so that p-type MOS transistors Q2 and Q41 have their gate terminals, source terminals, and drain terminals connected to each other, and therefore perform a parallel operation. Also, since p-type MOS transistors Q3 and Q43 have their gate terminals, source terminals, and drain terminals connected to each other, they perform a parallel operation.

As control voltage Vt40 is further increased such that bias current I1b becomes larger than control current IB, all switch circuits SW1 to SW4 turn on, so that p-type MOS transistors Q2, Q41, Q42 have their gate terminals, source terminals, and drain terminals connected to one another, and perform a parallel operation. Also, p-type MOS transistors Q3, Q43, Q44 have their gate terminals, source terminals, and drain terminals connected to one another, and perform a parallel operation.

The following equation is established for bias currents I1b, I2b, I41b, I42b which flow into n-type MOS transistor Q1 and p-type MOS transistors Q2, Q41, Q42, respectively:

[Equation 5]

$$I_{1b}=I_{2b}+I_{41b}+I_{42b} \tag{5}$$

Figure 9B:
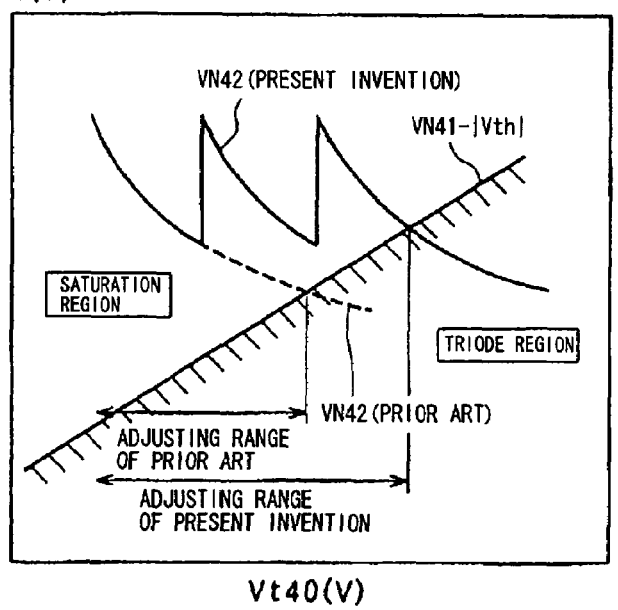
FIG. 9B is a diagram showing the relationship between voltage VN42 at node N42 generated by bias current I2b and control voltage Vt40 in FIG. 9A.

In a state where bias current I1 is smaller than control current IA, all switch circuits SW1 to SW4 remain in the off-state, causing bias current I1b to become equal to bias current I2b. When bias current I1b is between control currents IA and IB, switch circuit SW1 changes to the on-state, so that bias current I2b becomes equal to a value derived by subtracting bias current I41b from bias current I1b. As bias current I1b increases to a value higher than bias current IB, switch circuits SW1 and SW3 turn on, so that bias current I2b becomes equal to a value derived by subtracting bias current I41b and bias current I42b from bias current I1b. FIG. 9B shows the relationship between voltage VN42 at node N42 generated by bias current I2b and control voltage Vt40. It can be seen that voltage VN42 at node N42 has a characteristic in which there is a limited reduction in voltage value over a wide adjusting range of control voltage Vt40.

Specifically, the absolute value of the gate-source voltage of p-type MOS transistor Q2 is kept small, so that the operating point of p-type MOS transistor Q2 is maintained in the saturation region. Therefore, this embodiment is capable of highly linear operations over a wide GM value adjusting range with voltage signal Vin and output current Iout.

FOURTH EXAMPLE

Figure 10:
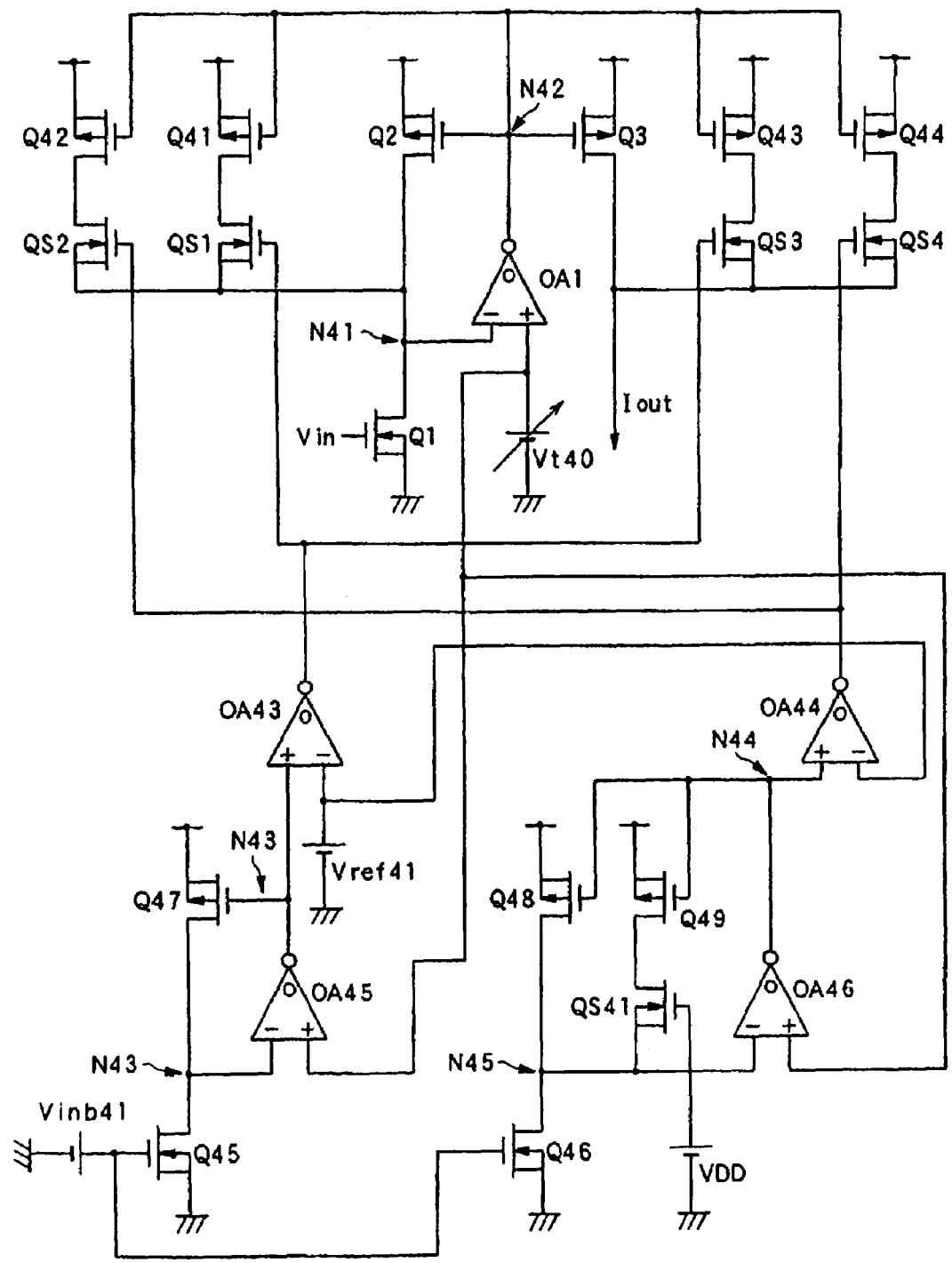
FIG. 10 is a circuit diagram illustrating a fourth example of the present invention.

FIG. 10 is a circuit diagram illustrating a fourth example of the present invention, more specifically showing the circuit diagram of FIG. 9A.

In FIG. 10, parts identical to those in FIG. 4 are designated the same reference numerals. In this embodiment, switch circuits SW1, SW2, SW3, SW4 in the fourth embodiment are replaced with n-type MOS transistors QS1, QS2, QS3, QS4, respectively. An output terminal of operational amplifier OA43 is connected to gate terminals, which are control terminals of n-type MOS transistors QS1 and QS3. An output terminal of operational amplifier OA44 is connected to gate terminals which are control terminals of n-type MOS transistors QS2 and QS4. Reference voltage Vref41 is applied to a minus (−) input terminal of operational amplifier OA43 and to a minus (−) input terminal of operational amplifier OA44. A gate terminal of p-type MOS transistor Q47 is connected to a plus (+) input terminal of operational amplifier OA43. A gate terminal of p-type MOS transistor Q48 is connected to a plus (+) input terminal of operational amplifier OA44. N-type MOS transistor Q45, p-type MOS transistor Q47, and operational amplifier OA45 are elements corresponding to n-type MOS transistor Q1, p-type MOS transistor Q2, and operational amplifier OA1, respectively. N-type MOS transistor Q46, p-type MOS transistor Q48, p-type MOS transistor Q49, n-type MOS transistor QS41, and operational amplifier OA46 are elements corresponding to n-type MOS transistor Q1, p-type MOS transistor Q2, p-type MOS transistor Q41, n-type MOS transistor QS1, and operational amplifier OA1, respectively.

Control voltage Vt40 is connected to plus (+) input terminals of operational amplifiers OA1, OA45, OA46. DC voltage signal Vinb41 is applied to gate terminals of n-type MOS transistors Q45 and Q46. DC voltage signal VDD, which is a high-level signal, is applied to a gate terminal of n-type MOS transistor QS41.

Control voltage Vt40 is increased from the ground voltage. When control voltage Vt40 has a sufficiently small value, all n-type MOS transistors QS1, QS2, QS3, QS4 remain in the off-state, so that DC voltage component VN42 at node N42 has a value equal to DC voltage component VN43. Also, DC voltage component VN44 at node N44 is a voltage higher than DC voltage components VN42 and VN43. As control voltage Vt40 is further increased, DC voltage components VN42 and VN43 simultaneously fall below reference voltage Vref41. In this event, since n-type MOS transistors QS1 and QS3 transition to the on-state, DC voltage component VN42 at node N42 increases to a value equal to DC voltage component VN44. As control voltage Vt40 is further increased, DC voltage components VN42 and VN44 next fall below reference voltage Vref41 simultaneously. In this event, n-type MOS transistors QS2 and QS4 transition to on-state, and DC voltage component VN42 increases. Therefore, DC voltage component VN42 has a value equal to or higher than reference voltage Vref41 over a wide adjusting range of control voltage Vt40. Accordingly, since the operating point of p-type MOS transistor Q2 is held in the saturation region, the linearity of the voltage/current conversion can be kept high in this example.

Fifth Embodiment

Figure 11:
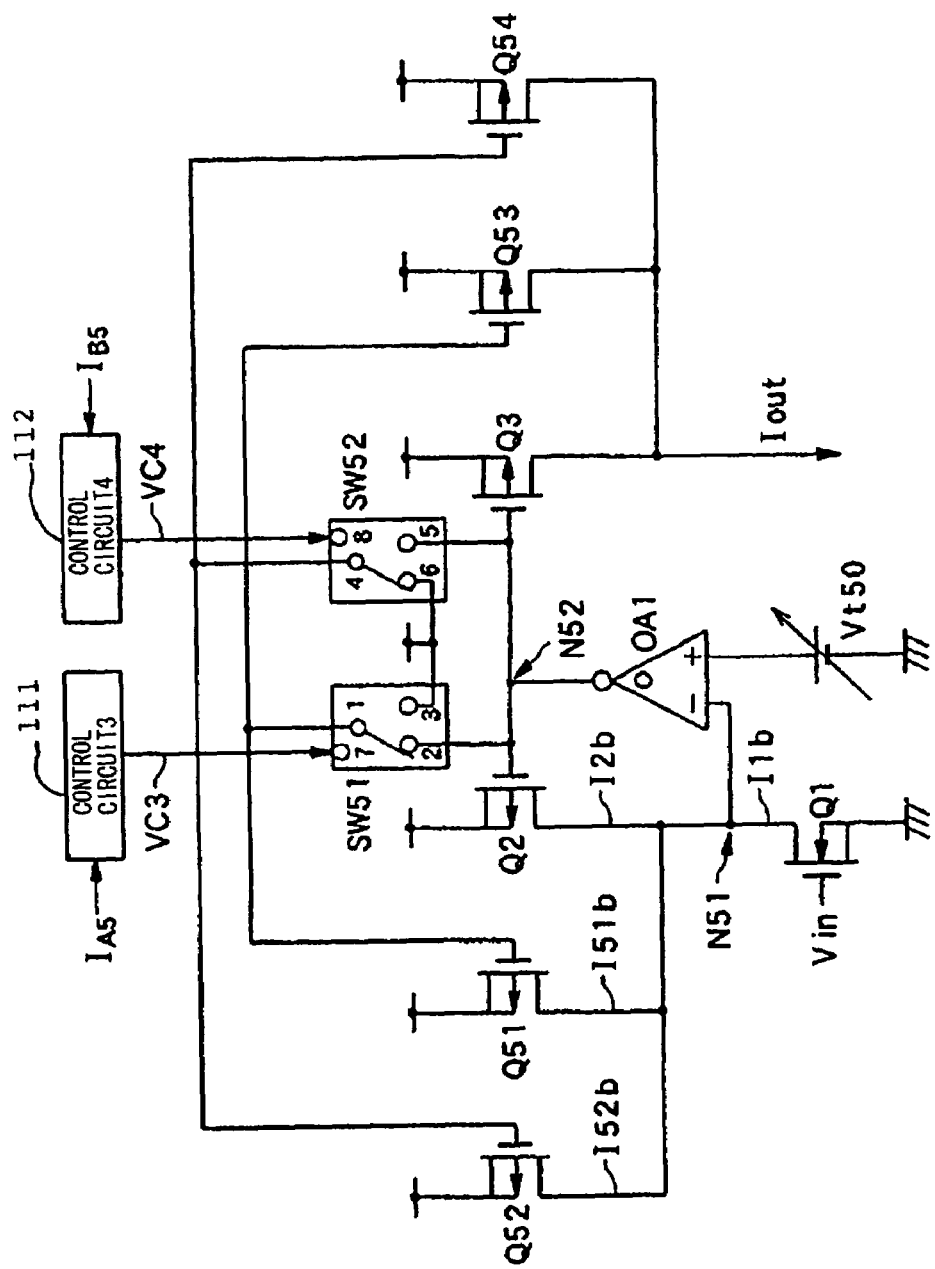
FIG. 11 is a circuit diagram illustrating a fifth embodiment of the present invention.

FIG. 11 is a circuit diagram illustrating a fifth embodiment of the present invention. N-type MOS transistor Q1, p-type MOS transistors Q2 and Q3, and operational amplifier OA1 are elements similar to the elements designated with corresponding reference numerals in FIG. 9. P-type MOS transistors Q51, Q52, Q53, Q54 in FIG. 11 are elements similar to p-type MOS transistors Q41, Q42, Q43, Q44 in FIG. 9, respectively.

In this embodiment, operational amplifier OA1 is used as an input section active element for performing a voltage/current conversion, and p-type MOS transistor Q2 is used as a potential control circuit. A gate terminal of p-type MOS transistor Q2 is connected to an output terminal of operational amplifier OA1, and a drain terminal of p-type MOS transistor Q2 is connected to a drain terminal of n-type MOS transistor Q1.

P-type MOS transistor Q3 is used as an output section voltage/current converter circuit. A gate terminal of p-type MOS transistor Q3 is connected to the gate terminal of p-type MOS transistor Q2. The drain terminal of p-type MOS transistor Q2 is connected to drain terminals of p-type MOS transistors Q51 and Q52. A drain terminal of p-type MOS transistor Q3 is connected to drain terminals of p-type MOS transistors Q53 and Q54. Input/output terminal 1 of switch circuit SW51 is connected to a gate terminal of p-type MOS transistor Q51 and to a gate terminal of p-type MOS transistor Q53. Input/output terminal 2 of switch circuit SW51 is connected to the gate terminal of p-type MOS transistor Q2, and input/output terminal 3 is connected to supply voltage V. Input/output terminal 4 of switch circuit SW52 is connected to a gate terminal of p-type MOS transistor Q52 and to a gate terminal of p-type MOS transistor Q54. Input/output terminal 5 of switch circuit SW52 is connected to the gate terminal of p-type MOS transistor Q2, and input/output terminal 6 is connected to supply voltage V.

An output terminal of control circuit 3 (111) is connected to control terminal 7 of switch circuit SW51, and an output terminal of control circuit 4 (112) is connected to control terminal 8 of switch circuit SW52.

When bias current I1b of n-type MOS transistor Q1 is equal to or smaller than current IA5 applied to control circuit 3, control signal VC3 is supplied from control circuit 3 to control terminal 7 of switch circuit SW51 to connect input/output terminals 2 and 3. As bias current I1b of n-type MOS transistor Q1 increases to current IA5 applied to control circuit 3 or larger, control signal VC3 is supplied from control signal circuit 3 to control terminal 7 of switch circuit SW51 to connect input/output terminals 1 and 2.

When bias current I1b of n-type MOS transistor Q1 is equal to or smaller than current IB5 applied to control circuit 4, control signal VC4 is supplied from control circuit 4 to control terminal 8 of switch circuit SW52 to connect input/output terminals 5 and 6. As bias current I1b of n-type MOS transistor Q1 increases to current IB5 applied to control circuit 4 or larger, control signal VC4 is supplied from control circuit 4 to control terminal 8 of switch circuit SW52 to connect input/output terminals 4 and 5.

Figure 1A:
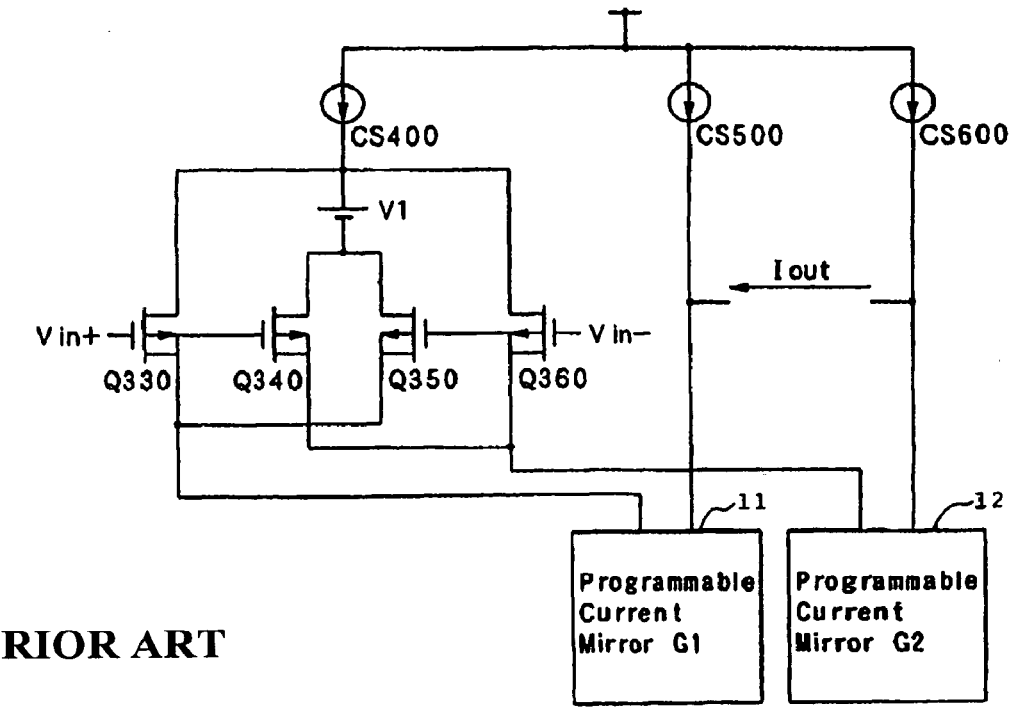
FIG. 1A is a diagram illustrating a first prior art example of a variable gain gm amplifier.
Figure 1B:
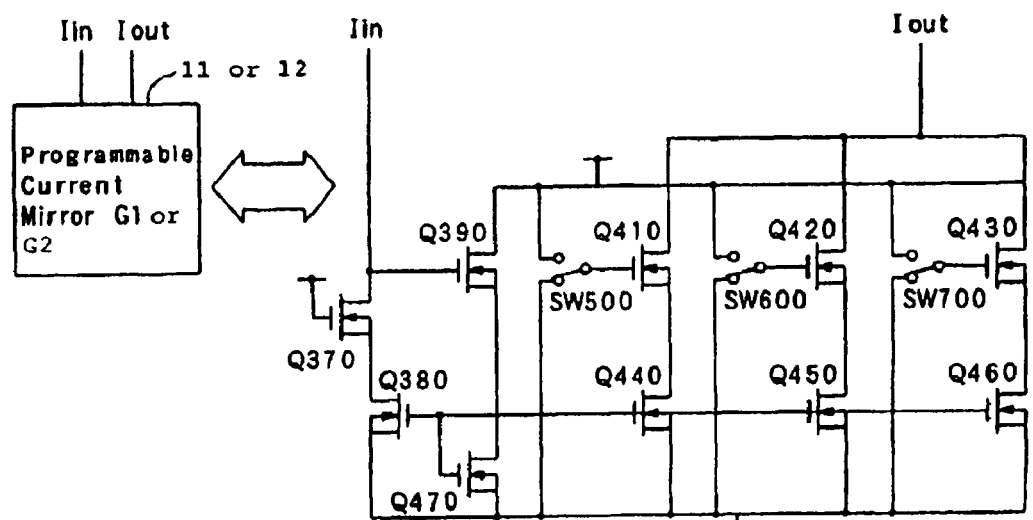
FIG. 1B is a diagram illustrating the internal configuration of a programmable current mirror circuit in FIG. 1A.
Figure 2:
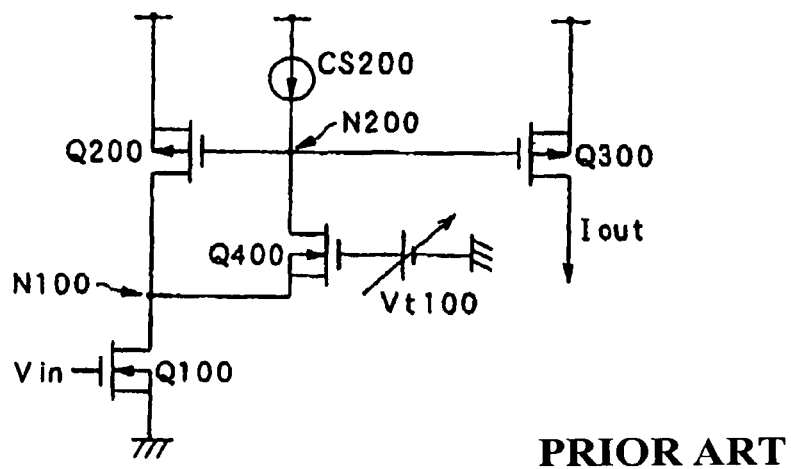
FIG. 2 is a diagram illustrating a second prior art example of a variable gain gm amplifier.

In this embodiment, an operation is performed in a similar manner to the circuit of the second prior art example in FIG. 2 when all the switch circuits are in the off-state. Specifically, potential VN51 at node N51 is adjusted by adjusting control voltage Vt50 to consequently adjust the Gm value.

When control voltage Vt50 is sufficiently small, and bias current I1b of n-type MOS transistor Q1 is smaller than current IA5 applied to control circuit 3, all switch circuits Q51 to Q54 turn off, so that voltage signal Vin applied to n-type MOS transistor Q1 is conveyed in the order of the source-drain current signal of n-type MOS transistor Q1, the gate voltage signal of p-type MOS transistor Q2, and current signal Iout of p-type MOS transistor Q3.

When control voltage Vt50 is increased to adjust bias current I1b of n-type MOS transistor Q1 between current IA5 and current IB5, input/output terminals 1 and 2 are connected, and p-type MOS transistors Q2 and Q51 have their gate terminals, source terminals, and drain terminals connected to each other to perform a parallel operation. Also, p-type MOS transistors Q3 and Q53 have their gate terminals, source terminals, and drain terminals connected to each other to perform a parallel operation.

As control voltage Vt50 is further increased to adjust bias current I1b of n-type MOS transistor Q1 to a value higher than current 15B, input/output terminals 4 and 5 of switch circuit SW52 are connected. As a result, p-type MOS transistors Q2, Q51, Q52 also have their gate terminals, source terminals, and drain terminals connected to each other, and therefore perform a parallel operation. Also, p-type MOS transistors Q3, Q53, Q54 have their gate terminals, source terminals, and drain terminals connected to one another to perform a parallel operation.

Equation (6) is established for bias currents which flow into n-type MOS transistor Q1 and p-type MOS transistors Q2, Q51, Q52:

[Equation 6]

$$I_{1b} = I_{2b} + I_{51b} + I_{52b} \qquad (6)$$

In a state where bias current I1$b$ of n-type MOS transistor Q1 is smaller than current IA5, switch circuits SW51 and SW52 remain in the off state, causing bias current I2$b$ of p-type MOS transistor Q2 to become equal to bias current I1$b$ of n-type MOS transistor Q1.

When bias current I1$b$ of n-type MOS transistor Q1 is adjusted between current IA5 and current IB5, input/output terminals 1 and 2 of switch circuit SW51 are connected, so that bias current I2$b$ of p-type MOS transistor Q2 becomes equal to a value derived by subtracting bias current I1$b$ of n-type MOS transistor Q51 from bias current I1$b$ of n-type MOS transistor Q1.

As bias current I1$b$ of n-type MOS transistor Q1 increases to current IB5 or higher, input/output terminals 4 and 5 of switch circuit SW52 are further connected, so that bias current I2$b$ of p-type MOS transistor Q2 becomes equal to a value derived by subtracting bias current I51$b$ of n-type MOS transistor Q51 and bias current I52$b$ of p-type MOS transistor Q52 from bias current I1$b$ of n-type MOS transistor Q1.

The relationship between potential VN51 at node N51 associated with bias current I2$b$ of p-type MOS transistor Q2 and control voltage Vt50 varies in a similar manner to the relationship between potential VN42 and control voltage Vt40 shown in FIG. 9B of the fourth embodiment. Bias current I2$b$ of p-type MOS transistor Q2 associated with potential VN51 at node N51 has the characteristic in which there is a suppressed increase over a wide adjusting range of control voltage Vt50. This means that the absolute value of the gate-source voltage of p-type MOS transistor Q2 is kept small, thus maintaining the operating point of p-type MOS transistor Q2 in the saturation region. Therefore, a degradation in the linearity caused by a transition of the operating point of p-type MOS transistor Q2 from the saturation region to the triode region does not occur over a wide adjusting range of control voltage Vt50, so that, according to this embodiment, the linearity of the voltage/current conversion can be kept high over a wide Gm value adjusting range.

FIFTH EXAMPLE

Figure 12:
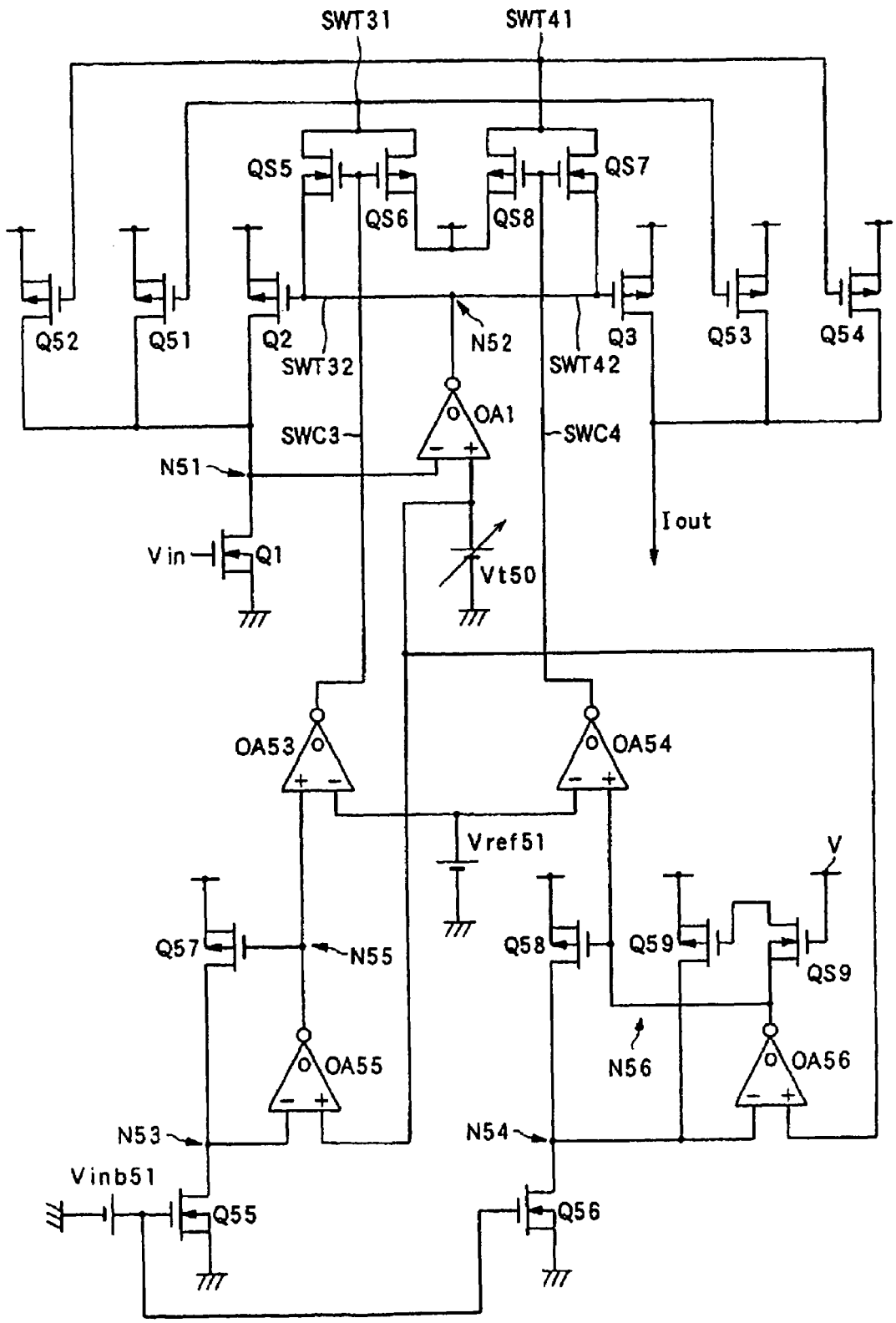
FIG. 12 is a circuit diagram illustrating a fifth example of the present invention.

FIG. 12 is a circuit diagram illustrating a fifth example of the present invention, more specifically showing the circuit diagram of FIG. 11.

In FIG. 12, parts identical to those in FIG. 10 are designated the same reference numerals.

In this embodiment, an element corresponding to switch circuit SW51 in FIG. 11 is composed of n-type MOS transistor QS5 and p-type MOS transistor QS6. A gate terminal of n-type MOS transistor QS5 is connected to a gate terminal of p-type MOS transistor QS6 to serve as control terminal SWC3; a drain terminal of n-type MOS transistor QS5 is connected to a drain terminal of p-type MOS transistor QS6 to serve as input/output terminal SWT31; and a source terminal of n-type MOS transistor QS5 is used as input/output terminal SWT32. A source terminal of p-type MOS transistor QS6 in turn is connected to supply voltage V.

Also, an element corresponding to switch circuit SW52 in FIG. 11 is composed of n-type MOS transistor QS7 and p-type MOS transistor QS8. A gate terminal of n-type MOS transistor QS7 is connected to gate terminal of p-type MOS transistor QS8 to serve as control terminal SWC4; a drain terminal of n-type MOS transistor WS7 is connected to a drain terminal of p-type MOS transistor QS8 to serve as input/output terminal SWT41; and a source terminal of n-type MOS transistor QS7 is used as input/output terminal SWT42. A source terminal of p-type MOS transistor QS8 in turn is connected to supply voltage V.

The gate terminal of n-type MOS transistor QS5 and the gate terminal of p-type MOS transistor QS6 are connected to an output terminal of operational amplifier OA53, and the gate terminal of n-type MOS transistor QS7 and the gate terminal of p-type MOS transistor QS8 are connected to an output terminal of operational amplifier OA54.

Reference voltage Vref 51 is applied to minus(−) input terminals of operational amplifier OA53 and operational amplifier OA54, and a gate terminal of p-type MOS transistor Q57 is connected to a plus (+) input terminal of operational amplifier OA53. N-type MOS transistor Q55, p-type MOS transistor Q57, and operational amplifier OA55 are elements corresponding to n-type MOS transistor Q1, p-type MOS transistor Q2, and operational amplifier OA1, respectively, and constitute a duplication circuit.

A gate terminal of p-type MOS transistor Q57 is connected to a plus (+) input terminal of operational amplifier OA54. N-type MOS transistors Q56 and Q58, p-type MOS transistors Q58 and Q59, and operational amplifier OA56 are elements corresponding to n-type MOS transistors Q1 and QS5, p-type MOS transistors Q2 and Q51, and operational amplifier OA1, respectively. Control voltage Vt50 is applied to plus (+) input terminals of operational amplifiers OA1, OA55, OA56.

DC signal Vinb51 is applied to gate terminals of n-type MOS transistors Q55 and Q56.

When control voltage Vt50 is close to the ground voltage and sufficiently small, potentials VN55 and VN56 at nodes N55 and N56 are higher than Vref 51, so that output voltages of operational amplifier OA53 and operational amplifier OA54 are low-level outputs. As a result, n-type MOS transistors QSS5 and QS7 turn off, while p-type MOS transistors QS6 and QS8 turn on. As a result, since the respective gate terminals of p-type MOS transistors Q51, Q52, Q53, Q54 are connected to supply voltage V, p-type MOS transistors Q51, Q52, Q53, Q54 turn off. For reference, DC voltage VN52 at node N52 is equal to DC voltage VN55 at node N55, and DC voltage component VN56 at node N56 has a voltage value sufficiently higher than VN52 and VN55.

As control voltage Vt50 is further increased, VN52 and VN55 simultaneously fall below reference voltage Vref51 while they maintain the equal value. In this event, an output potential of operational amplifier OA53 goes to high level. As a result, n-type MOS transistor QS5 turns on, while p-type MOS transistor QS6 turns off, causing VN52 to increase to a value equal to VN56.

As control voltage Vt50 is further increased, VN52 and VN56 simultaneously fall below reference voltage Vref51. In this event, n-type MOS transistor QS7 turns on, while p-type MOS transistor QS8 turns off, causing VN52 to increase. Therefore, since VN52 is equal to or higher than reference voltage Vref51 over a wide adjusting range of control voltage Vt50, the operating point of p-type MOS transistor Q2 is kept in the saturation region, thus keeping high linearity for the voltage/current converter circuit of this example.

Sixth Embodiment

Figure 13A:
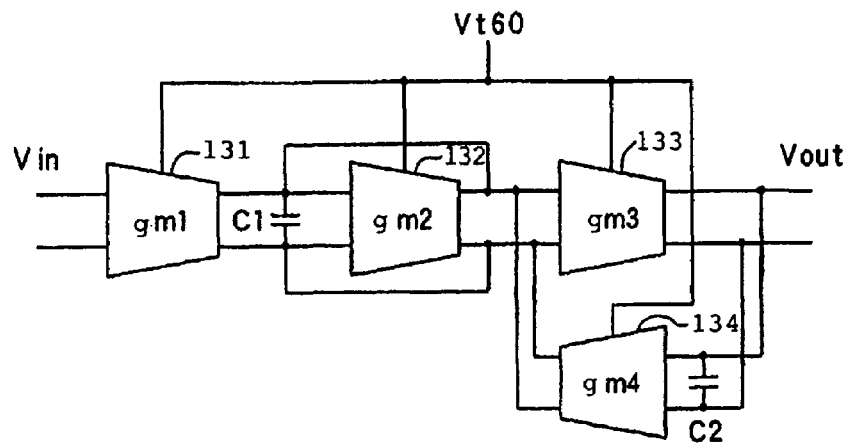
FIG. 13A is a circuit diagram illustrating a sixth embodiment of the present invention.
Figure 13B:
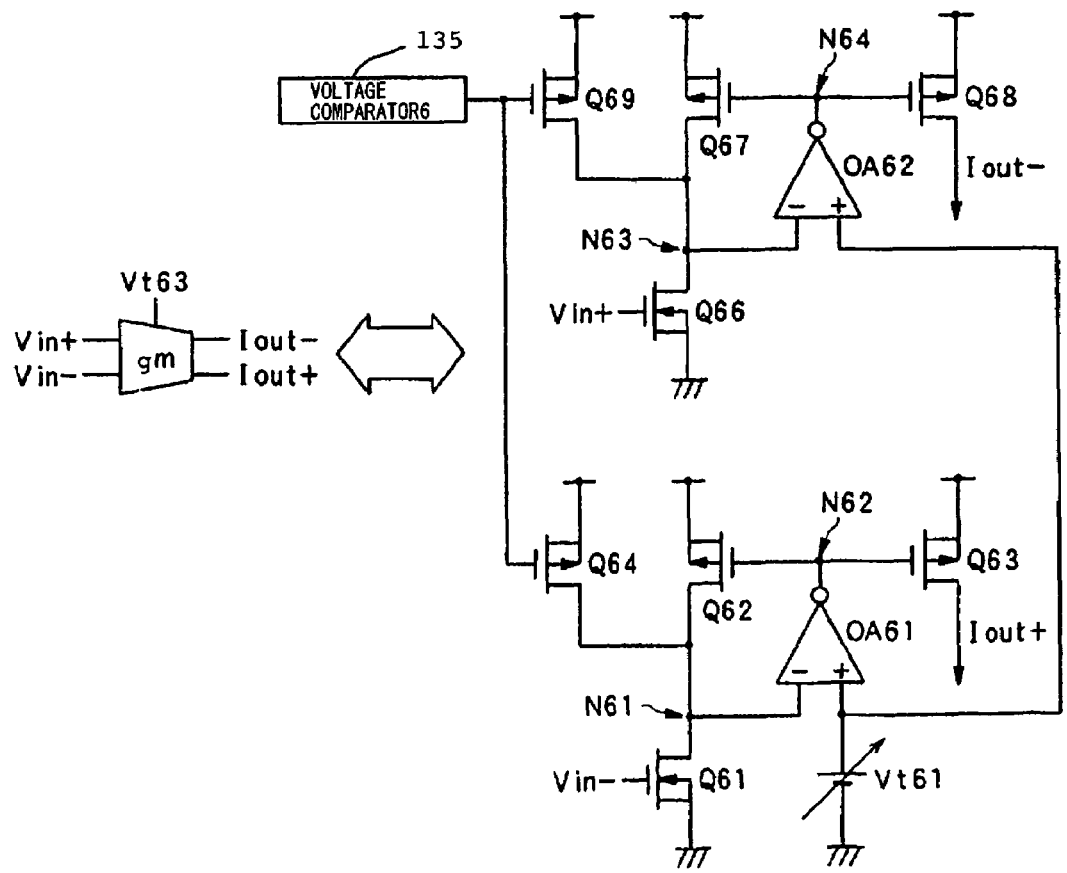
FIG. 13B a detailed circuit diagram of variable gain voltage/current converter circuits gm1 to gm4 in FIG. 13A.

FIG. 13A is a circuit diagram illustrating a sixth embodiment of the present invention, and FIG. 113B is a detailed circuit diagram of variable gain voltage/current converter circuits gm1 to gm4 (131 to 134) shown in FIG. 13A. The variable gain voltage/current converter circuit of the first embodiment illustrated in FIG. 4 is used for the variable gain voltage/current converter circuits of the sixth embodiment, and these and capacitive elements C1 and C2 are used to constitute a wide-bandwidth variable secondary low pass filter circuit. The transfer function of this filter circuit is shown in Equation (7):

[Equation 7]

$$F(S) = \frac{\frac{gm_1 \cdot gm_3}{C_1 \cdot C_2}}{S^2 + \frac{gm_2}{C_1}S + \frac{gm_3 \cdot gm_4}{C_1 \cdot C_2}} \quad (7)$$

As the gains of the four amplifiers (gm1 to gm4) are increased by a factor of A by controlling control voltage Vt60, the transfer function is given by:

[Equation 8]

$$\frac{\frac{A \cdot gm_1 \cdot A \cdot gm_3}{C_1 \cdot C_2}}{S^2 + \frac{A \cdot gm_2}{C_1}S + \frac{A \cdot gm_3 \cdot A \cdot gm_4}{C_1 \cdot C_2}} = \frac{\frac{gm_1 \cdot gm_3}{C_1 \cdot C_2}}{\left(\frac{S}{A}\right)^2 + \frac{gm_2}{C_1} \cdot \frac{S}{A} + \frac{gm_3 \cdot gm_4}{C_1 \cdot C_2}} \quad (8)$$

$$= F\left(\frac{S}{A}\right)$$

Figure 14:
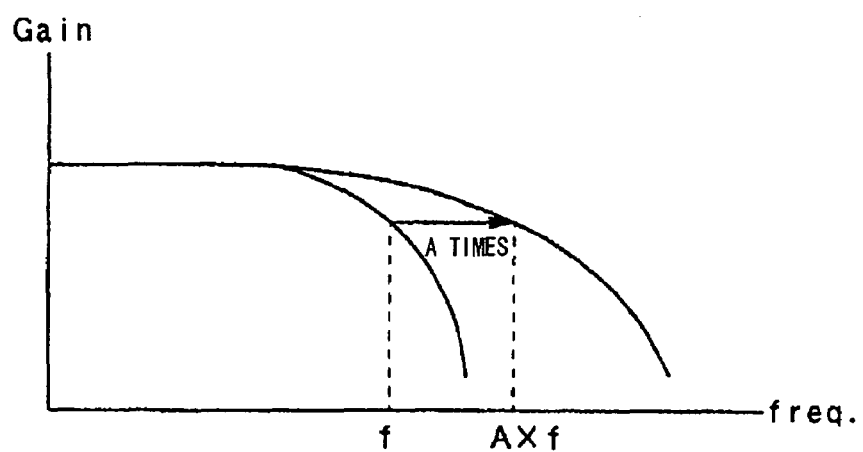
FIG. 14 is a circuit for describing the operation of the sixth embodiment of the present invention.

It is understood that the new transfer function is increased by a factor of A with respect to a frequency axis over the original transfer function. In other words, it is understood that the bandwidth of the new transfer function is increased A times more than the frequency bandwidth of the original transfer function. This behavior is shown in FIG. 14.

In the foregoing embodiments and examples, all n-type MOS transistors can be replaced with p-type MOS transistors, and all p-type MOS transistors with n-type MOS transistors. Further, these elements may be replaced with arbitrary active elements such as bipolar transistors, MES type FET's and the like.

The invention claimed is:

1. A variable gain voltage/current converter circuit comprising:
   an input section active element having an input terminal, an output terminal, and a ground terminal for performing voltage/current conversion;
   a potential control circuit for controlling a conversion gain of said input section active element based on a potential at the output terminal of said input section active element;
   an output section voltage/current converter circuit for generating a current corresponding to a voltage signal generated from said potential control circuit; and
   a current compensation circuit connected to the output terminal of said input section active element for generating a DC current in accordance with the amount of DC current which flows from the output terminal of said input section active element to the ground terminal of said input section active element.

2. The variable gain voltage/current converter circuit according to claim 1, wherein:
   said potential control circuit comprises:
   a voltage comparator circuit having a first input terminal applied with a potential control signal, and a second input terminal connected to the output terminal of said input section active element; and
   an intervening active element having an input terminal connected to the output terminal of said voltage comparator circuit, and an output terminal connected to the output terminal of said input section active element for performing voltage/current conversion.

3. The variable gain voltage/current converter circuit according to claim 2, wherein said voltage comparator circuit includes an operational amplifier.

4. The variable gain voltage/current converter circuit according to claim 1, wherein said current compensation circuit includes an active element which has an input terminal applied with a current compensation voltage signal, and an output terminal connected to the output terminal of said input section active element.

5. The variable gain voltage/current converter circuit according to claim 2, wherein a circuit for generating the current compensation voltage signal comprises:
   an operational amplifier applied with a reference voltage signal at a first input terminal, and applied with an input voltage signal of a duplication circuit of said intervening active element at a second input terminal; and
   an active element having an input terminal connected to the output terminal of said operational amplifier, said output terminal being connected to an output terminal of the duplication circuit of said input section active element.

6. The variable gain voltage/current converter circuit according to claim 1, wherein said active element forming part of said variable gain voltage/current converter circuit includes a field effect transistor or a bipolar transistor.

7. A filter circuit comprising:
   a combinational circuit of the variable gain voltage/current converter circuit according to claim 1, and a capacitive element; and
   means for adjusting a pass frequency band by changing the gain of said variable gain voltage/current converter circuit.

* * * * *